(12) United States Patent
Clifton et al.

(10) Patent No.: US 6,702,661 B1
(45) Date of Patent: Mar. 9, 2004

(54) COOLING METHOD AND APPARATUS

(75) Inventors: Mark B. Clifton, West Windsor, NJ (US); Ivan Pawlenko, Holland, PA (US); Larry Samson, Langhorne, PA (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 10/303,378

(22) Filed: Nov. 25, 2002

(51) Int. Cl.[7] .................................................. H05K 5/00
(52) U.S. Cl. ........................................ 454/184; 361/695
(58) Field of Search ............................ 454/184; 361/695

(56) References Cited

U.S. PATENT DOCUMENTS 6,590,769 B2 * 7/2003 Hilpert et al. .............. 361/695

* cited by examiner

*Primary Examiner*—Jiping Lu

(57) ABSTRACT

A cooling system of the invention can be used, for example, for cooling of electrical circuit boards housed in an equipment cabinet. The cooling system includes a flow-rate-amplifying pump configured to introduce ambient air into the cabinet. The pump is a passive device, which has a primary intake and a secondary intake and is designed to convert a small volume of compressed air applied to the secondary intake into a large flow of relatively cool ambient air into the cabinet through the primary intake. In one embodiment, the cooling system is designed to use the heat generated within the cabinet to produce compressed air. The air circulating around the circuit boards heats up and rises to the top of the cabinet, where it, is channeled toward an air vent. When the air exits through the vent, it rotates an appropriately placed propeller. The torque generated by the propeller is then used to drive an air compressor, the output of which is coupled to the secondary intake of the air amplifying pump. A cooling system of the invention can provide efficient cooling while generating less noise and/or electrical interference than prior art cooling systems.

20 Claims, 3 Drawing Sheets

COOLING METHOD AND APPARATUS

BACKGROUND OF THE INVENTION

1. Field of the Invention

The present invention relates to cooling electrical equipment.

2. Description of the Related Art

FIGS. 1A–B schematically show a cut-away side view of an equipment cabinet 100 of the prior art and a perspective view of an array 106 of electrical fans 108 used in cabinet 100. Cabinet 100 houses equipment components such as, for example, printed circuit boards 102 typically mounted on a rack 104. During operation, boards 102 may generate a significant amount of heat. To protect boards 102 from overheating, cabinet 100 has a cooling system including two arrays 106a–b, with one array placed at the top and another array at the bottom of cabinet 100. Fans 108 of arrays 106a–b provide cool air intake and/or hot air exhaust for cabinet 100. In a typical configuration, relatively cool ambient air is drawn into cabinet 100 by rotating blades of fans 108. The, air then circulates within the cabinet before being exhausted through air vents 110 on the sides of cabinet 100. The air heats up during the circulation as it cools down boards 102. Alternatively, cabinet 100 can be connected to a heat exchanger to form a closed-loop system designed to circulate air without introducing ambient air into the system.

One problem with cabinet 100 is that each fan 108 is a source of electrical noise, which may interfere with electrical signals in boards 102. In addition, fans 108 generate mechanical noise and vibrations. Furthermore, due to a relatively large number of continuously running fans in cabinet 100, it is not unusual that at least one of the fans is broken and requires repair and/or replacement.

SUMMARY OF THE INVENTION

The problems in the prior art are addressed in accordance with the principles of the invention by a cooling system, which can be used, for example, for cooling of electrical circuit boards housed in an equipment cabinet. The cooling system includes a flow-rate-amplifying pump configured to introduce ambient air into the cabinet. The pump is a passive device, which has a primary intake and a secondary intake and is designed to convert a small volume of compressed air applied to the secondary intake into a large flow of relatively cool ambient air into the cabinet through the primary intake. In one embodiment, the cooling system is designed to use the heat generated within the cabinet to produce compressed air. The air circulating around the circuit boards heats up and rises to the top of the cabinet, where it is channeled toward an air vent. When the air exits through the vent, it rotates an appropriately placed propeller. The torque generated by the propeller is then used to drive an air compressor, the output of which is coupled to the secondary intake of the air amplifying pump. A cooling system of the invention can provide efficient cooling while generating less noise and/or electrical interference than prior art cooling systems.

According to one embodiment, the present invention is a ventilated equipment cabinet for housing and cooling heat-generating electrical equipment, comprising: (a) an enclosure adapted to house the electrical equipment and having one or more air vents; and (b) a flow-rate-amplifying pump having a primary intake, a secondary intake, and an exhaust port, wherein: the primary intake is connected to an opening in the enclosure; the secondary intake is connected to receive compressed gas from a compressed-gas supply, such that, the compressed gas induces a flow of ambient air from the primary intake to the exhaust port; and the exhaust port is configured to introduce the flow into the enclosure, such that the air heats up as it cools the electrical equipment and exits the enclosure through the one or more air vents.

According to another embodiment, the present invention is an apparatus adapted to ventilate the interior of an enclosure having one or more air vents, the apparatus comprising: (a) a flow-rate-amplifying pump having a primary intake, a secondary intake, and an exhaust port, wherein: the primary intake is adapted to be connected to an opening in the enclosure; the secondary intake is adapted to be connected to receive compressed gas from a compressed-gas supply, such that, the compressed gas induces a flow of ambient air from the primary intake to the exhaust port; and the exhaust port is configured to introduce the flow into the enclosure, such that the air heats up as it cools equipment housed in the enclosure and exits the enclosure through the one or more air vents; and (b) the compressed-gas supply adapted to generate the compressed gas using heated air generated within the enclosure.

According to yet another embodiment, the present invention is a method of cooling heat-generating electrical equipment housed in a ventilated equipment cabinet, comprising applying compressed gas to a secondary intake of a flow-rate-amplifying pump, wherein: the pump has a primary intake, the secondary intake, and an exhaust port; the primary intake is connected to an opening in the enclosure; the secondary intake is connected to receive compressed gas from a compressed-gas supply, such that, the compressed gas induces a flow of ambient air from the primary intake to the exhaust port; and the exhaust port is configured to introduce the flow into the enclosure, such that the air heats up as it cools the electrical equipment and exits the enclosure through the one or more air vents.

BRIEF DESCRIPTION OF THE DRAWINGS

Other aspects, features, and benefits of the present invention will become more fully apparent from the following detailed description, the appended claims, and the accompanying drawings in which:

DETAILED DESCRIPTION

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments.

Figure 1B:
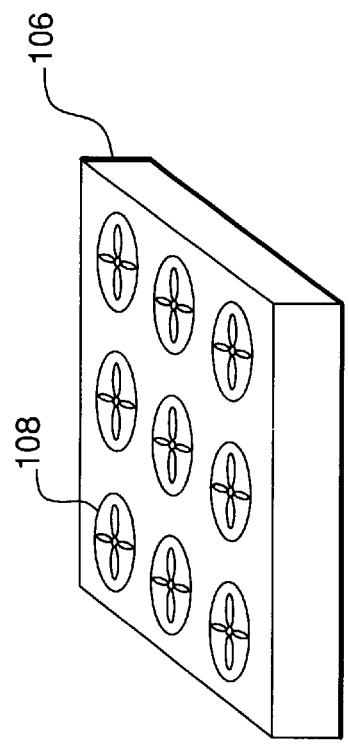
FIG. 1B schematically shows a perspective view of an array of fans used in the cabinet of FIG. 1A.
Figure 1A:
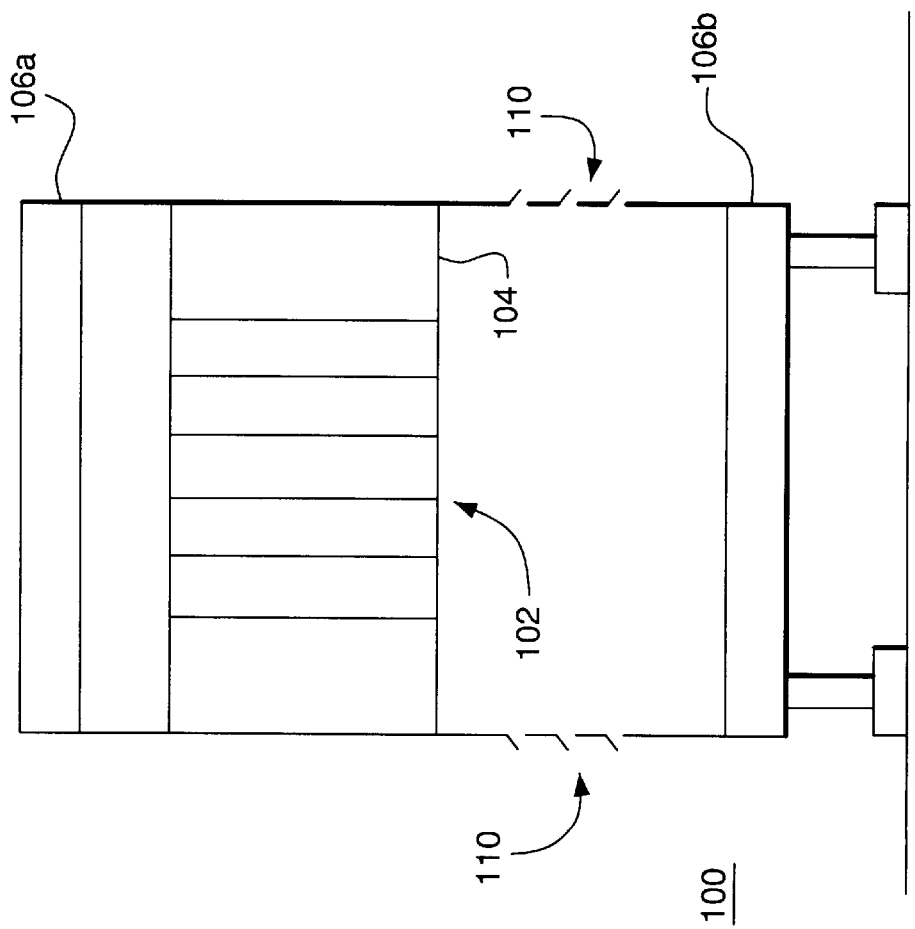
FIG. 1A schematically shows a cut-away side view of an equipment cabinet of the prior art.
Figure 2:
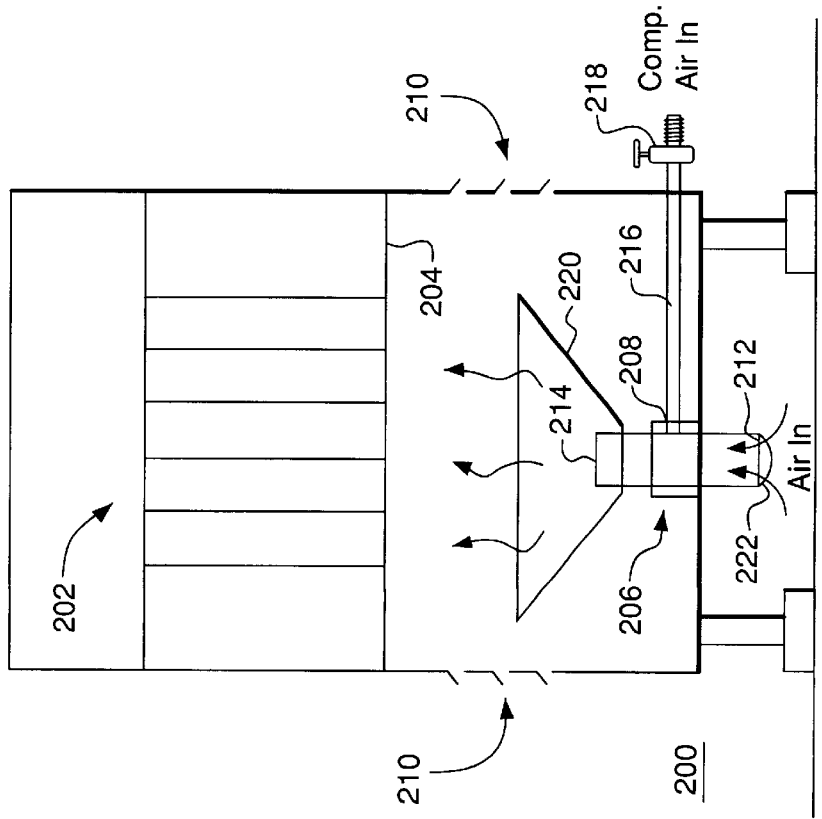
FIG. 2 schematically shows a cut-away side view of an equipment cabinet according to one embodiment of the present invention.

FIG. 2 schematically shows a cut-away side view of an equipment cabinet 200 according to one embodiment of the present invention. Cabinet 200 is similar to cabinet 100 of FIG. 1. In particular, cabinet 200 has a cooling system and may house printed circuit boards 202 mounted on a rack 204. However, the cooling system of cabinet 200 is different from that of cabinet 100. For example, instead of the fan arrays used in cabinet 100, cabinet 200 has a flow-rate-amplifying pump 206 designed to operate based on the Coanda effect well known in the arts of air-dynamics. More specifically, pump 206 is a passive device, which preferably does not have moving parts, designed to convert a small volume of compressed air applied to a secondary intake 208 into a large flow of air from a primary intake 212 to an exhaust port 214. Pump 206 preferably provides a volume ratio of about 1:40 between secondary intake 208 and exhaust port 214. In one embodiment, pump 206 is a CDF series vacuum pump model 2000H available from Vaccon Company, Inc., of Medfield, Mass. In a different embodiment, a different flow-rate-amplifying pump may be similarly used.

Pump 206 is mounted such that primary intake 212 and exhaust port 214 are located outside and inside, respectively, of cabinet 200. Ambient air is drawn into intake 212 and is exhausted through port 214 into cabinet 200, where it circulates around boards 202. The air heats up during the circulation as it cools down boards 202. The heated air is exhausted through air vents 210 on the sides of cabinet 200. In a different embodiment, the air vents can be placed above boards 202 either on the sides or top of cabinet 200.

In one embodiment, secondary intake 208 is connected to an external compressed-air line (not shown) by an air-tight hose 216 optionally having a regulator valve 218. Primary intake 212 may be equipped with an optional air filter 222 to reduce the amount of ambient debris (e.g., dust) drawn into cabinet 200 through pump 206. Exhaust port 214 may be equipped with an optional funnel (or nozzle) 220 for better air distribution inside cabinet 200. In different embodiments, different funnel shapes may be used.

Since the cooling system of cabinet 200 does not have electrical components such as, e.g., electrical fans or motors, it may provide one or more of the following benefits over the cooling system of cabinet 100: less mechanical vibration, no electrical interference, greater reliability due to the absence of fans, and less expensive maintenance.

Figure 3:
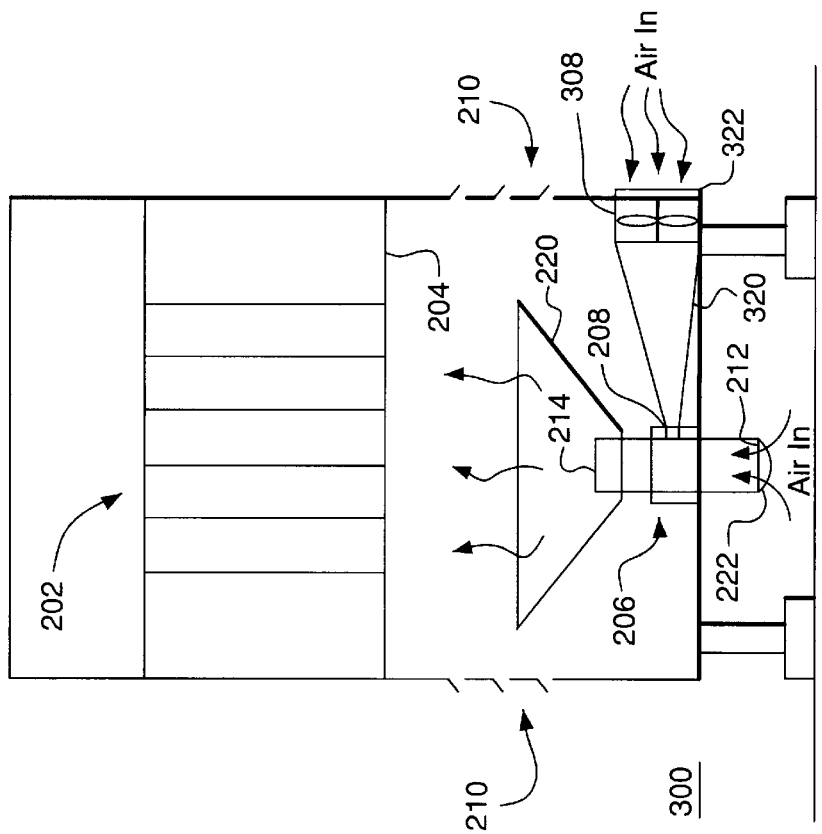
FIG. 3 schematically shows a cut-away side view of an equipment cabinet according to another embodiment of the present invention.

FIG. 3 schematically shows a cut-away side view of an equipment cabinet 300 according to another embodiment of the present invention. The cooling system in cabinet 300 is similar to that in cabinet 200 of FIG. 2. However, the cooling systems of cabinets 200 and 300 differ in the manner, in which compressed air for secondary intake 208 of pump 206 is generated. More specifically, instead of using compressed air from an external line as in cabinet 200, cabinet 300 has a fan 308 configured to draw ambient air through an optional air filter 322 and introduce that air into a funnel-shaped duct 320 coupled to intake 208. The applicants' own tests demonstrated that a representative electrical fan, e.g., similar to fan 108 (FIG. 1B), is capable of inducing a pressure increase of about 2 pounds per square inch (psi) in duct 320 and thus generating compressed air at intake 208. An air flow through pump 206 into cabinet 300 induced by that compressed air is comparable with the air flow generated by arrays 106 in cabinet 100. As a result, comparable cooling efficiency is achieved in cabinet 200 using a single electrical fan instead of an array of fans.

Since the cooling system of cabinet 300 has only one electrical fan, it generates less mechanical vibration and less electrical interference than the cooling system of cabinet 100. In addition, the cooling system of cabinet 300 may be relatively inexpensive to maintain.

Figure 4:
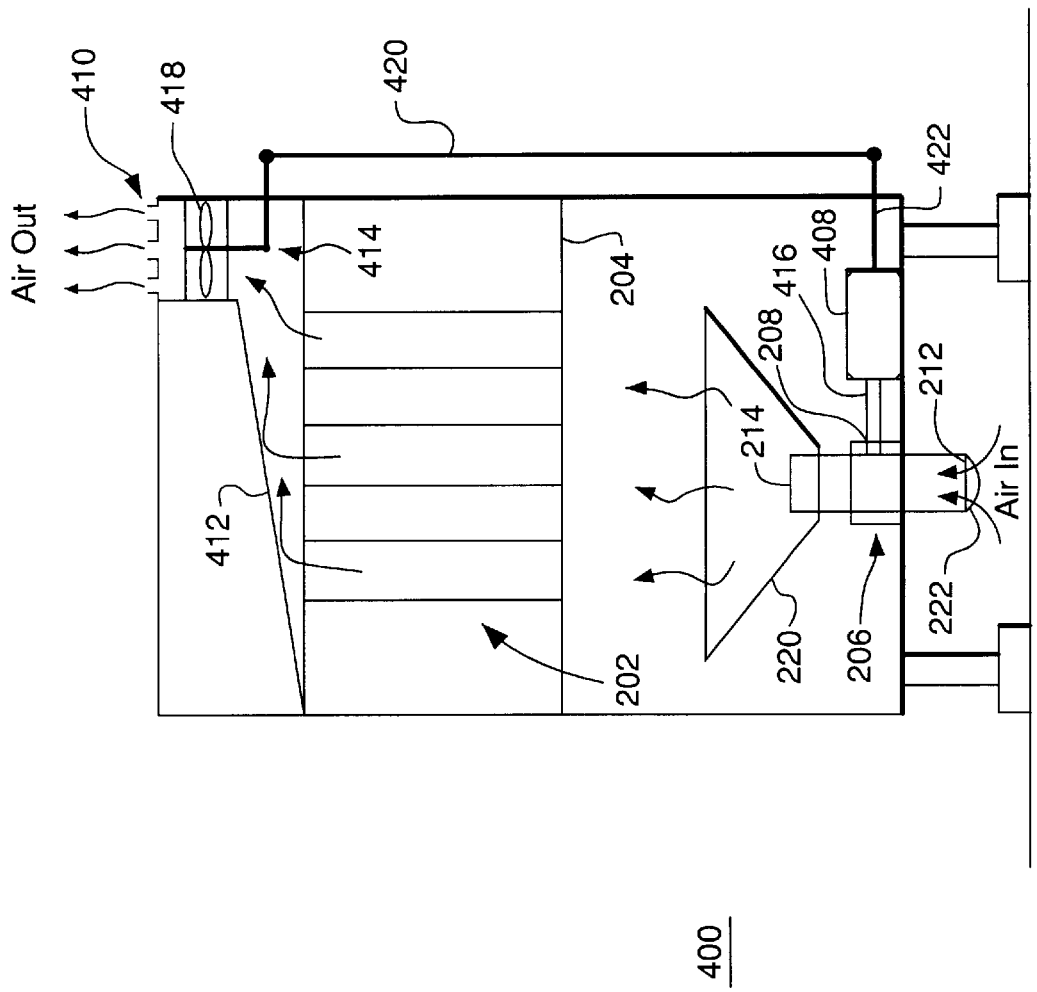
FIG. 4 schematically shows a cut-away side view of an equipment cabinet according to yet another embodiment of the present invention.

FIG. 4 schematically shows a cut-away side view of an equipment cabinet 400 according to yet another embodiment of the present invention. The cooling system in cabinet 400 is similar to those in cabinets 200 and 300 of FIGS. 2 and 3, respectively. However, in contrast with those cooling systems, the cooling system of cabinet 400 is designed to utilize the heat produced within the cabinet to generate compressed air. That compressed air is then applied to secondary intake 208 of pump 206 to generate the flow of ambient air into cabinet 400.

In one embodiment, cabinet 400 has air vents 410 located at the top of the cabinet and preferably does not have air vents (e.g., similar to vents 210) on the sides of the cabinet. Hot air generated due to the heat released by boards 202 rises to the top of cabinet 400 and is directed by an air deflector 412 toward an air channel 414 located beneath air vents 410. A ventilator (e.g., propeller) 418 placed in channel 414 rotates when air passes through it. This rotation is then used to drive an air compressor 408, the output of which is coupled to secondary intake 208 of pump 206 via hose 416.

In one embodiment, compressor 408 is a mechanically actuated pump, e.g., a worm gear pump or a peristaltic pump. In one configuration, compressor 408 outputs compressed air into hose 416 when a shaft 422 is rotated. A mechanical linkage 420 couples the axle of ventilator 418 and shaft 422 such that rotation of ventilator 418 is transformed into a corresponding rotation of shaft 422. Although compressor 408 is illustratively shown next to pump 206 in FIG. 4, in a different configuration, compressor 408 may be placed next to ventilator 418 to reduce the length of linkage 420. Hose 416 of a suitable length is used to connect the output of compressor 408 to intake 208.

In another embodiment, compressor 408 has an electrical pump and a small electrical generator coupled to shaft 422. When shaft 422 is rotated, e.g., as described above, the generator produces electricity, which is used to power the electrical pump.

In one embodiment, in addition to a pump, compressor 408 has an electrical motor powered, e.g., by a battery, and coupled to shaft 422. The purpose of having the motor is to rotate shaft 422 in order to induce air circulation in cabinet 400 when boards 202 have just been turned on and are not yet radiating enough heat. The motor is automatically disengaged from shaft 422 when, for example, the temperature inside cabinet 400 exceeds a certain threshold, at which the operation of ventilator 418, compressor 408, and pump 206 is self-sustaining.

In one embodiment, ventilator 418, linkage 420, and shaft 422 are fabricated using lightweight materials. Linkage 420 may be implemented using a flexible drive shaft as known in the art. The size of ventilator 418 is chosen such that it generates enough torque to drive compressor 408 and overcome friction losses. Alternatively, cabinet 400 may have two or more ventilators 418, each placed into a corresponding air channel and coupled to shaft 422. In different embodiments, each ventilator 418 may be one of, e.g., a propeller, a drum with paddles, a wheel with fins, etc.

Compared to the cooling system of cabinet 100, embodiments of the present invention may provide one or more of the following benefits: less noise, less electrical interference, greater reliability due to a fewer number of fans, and less expensive maintenance.

While this invention has been described with reference to illustrative embodiments, this description is not intended to be construed in a limiting sense. Although the invention was described in reference to equipment cabinets containing circuit boards, it may also be used with other enclosures containing different heat-radiating devices. Different components of a cooling system of the invention may be variously placed relative to each other inside the enclosure without departing from the principles of the invention. Compressed gas other than compressed air (e.g., nitrogen or argon) may be applied to the secondary intake of an amplifying pump. Motion other than rotation, for example, linear oscillation, may be (i) generated using a flow of air through a piston and/or (ii) applied to drive a compressor. Various modifications of the described embodiments, as well as other embodiments of the invention, which are apparent to persons skilled in the art to which the invention pertains are deemed to lie within the principle and scope of the invention as expressed in the following claims.

Although the steps in the following method claims, if any, are recited in a particular sequence with corresponding labeling, unless the claim recitations otherwise imply a particular sequence for implementing some or all of those steps, those steps are not necessarily intended to be limited to being implemented in that particular sequence.

What is claimed is:

1. A ventilated equipment cabinet for housing and cooling heat-generating electrical equipment, comprising:
   (a) an enclosure adapted to house the electrical equipment and having one or more air vents; and
   (b) a flow-rate-amplifying pump having a primary intake, a secondary intake, and an exhaust port, wherein:
      the primary intake is connected to an opening in the enclosure;
      the secondary intake is connected to receive compressed gas from a compressed-gas supply, such that, the compressed gas induces a flow of ambient air from the primary intake to the exhaust port; and
      the exhaust port is configured to introduce the flow into the enclosure, such that the air heats up as it cools the electrical equipment and exits the enclosure through the one or more air vents.

2. The invention of claim 1, wherein the compressed-gas supply comprises a fan coupled to the secondary intake by a duct, wherein the fan is adapted to generate the compressed gas by inducing a pressure increase in the duct with respect to ambient pressure.

3. The invention of claim 1, wherein the cabinet is adapted to generate the compressed gas using heated air generated within the enclosure.

4. The invention of claim 3, wherein:
   at least one air vent is configured with a movable part adapted to move in response to a flow of heated air exiting the enclosure through the vent; and
   the compressed-gas supply comprises a compressor mechanically coupled to the movable part and adapted to generate the compressed gas using the motion of the movable part.

5. The invention of claim 4, wherein the enclosure comprises an air deflector adapted to direct the flow of heated air toward the vent.

6. The invention of claim 4, wherein the compressor has a mechanically actuated pump driven by the motion of the movable part.

7. The invention of claim 4, wherein:
   the compressor has an electrical pump and an electrical generator;
   the generator is adapted to generate electricity using the motion of the movable part; and
   the electrical pump is configured to be powered by the electricity and adapted to generate the compressed gas.

8. The invention of claim 4, wherein:
   the movable part comprises a propeller; and
   the motion of the movable part is rotation of the propeller.

9. An apparatus adapted to ventilate the interior of an enclosure having one or more air vents, the apparatus comprising:
   (a) a flow-rate-amplifying pump having a primary intake, a secondary intake, and an exhaust port, wherein:
      the primary intake is adapted to be connected to an opening in the enclosure;
      the secondary intake is adapted to be connected to receive compressed gas from a compressed-gas supply, such that, the compressed gas induces a flow of ambient air from the primary intake to the exhaust port; and
      the exhaust port is configured to introduce the flow into the enclosure, such that the air heats up as it cools equipment housed in the enclosure and exits the enclosure through the one or more air vents; and
   (b) the compressed-gas supply adapted to generate the compressed gas using heated air generated within the enclosure.

10. The invention of claim 9, wherein:
    at least one air vent is configured with a movable part adapted to move in response to a flow of heated air exiting the enclosure through the vent; and
    the compressed-gas supply comprises a compressor mechanically coupled to the movable part and adapted to generate the compressed gas using the motion of the movable part.

11. The invention of claim 10, wherein the compressor has a mechanically actuated pump driven by the motion of the movable part.

12. The invention of claim 10, wherein:
    the compressor has an electrical pump and an electrical generator;
    the generator is adapted to generate electricity using the motion of the movable part; and
    the electrical pump is configured to be powered by the electricity and adapted to generate the compressed gas.

13. The invention of claim 12, wherein the electrical pump is adapted to be selectively powered by a battery to initiate the flow.

14. The invention of claim 10, wherein:
    the movable part comprises a propeller; and
    the motion of the movable part is rotation of the propeller.

15. A method of cooling heat-generating electrical equipment housed in a ventilated equipment cabinet, comprising applying compressed gas to a secondary intake of a flow-rate-amplifying pump, wherein:
    the pump has a primary intake, the secondary intake, and an exhaust port;
    the primary intake is connected to an opening in the enclosure;
    the secondary intake is connected to receive compressed gas from a compressed-gas supply, such that, the compressed gas induces a flow of ambient air from the primary intake to the exhaust port; and
    the exhaust port is configured to introduce the flow into the enclosure, such that the air heats up as it cools the electrical equipment and exits the enclosure through the one or more air vents.

16. The invention of claim 15, wherein the compressed-gas supply comprises a fan coupled to the secondary intake by a duct, wherein the fan generates the compressed gas by inducing a pressure increase in the duct with respect to ambient pressure.

17. The invention of claim 15, further comprising generating the compressed gas using heated air generated within the enclosure.

18. The invention of claim 17, wherein:

at least one air vent is configured with a movable part that moves in response to a flow of heated air exiting the enclosure through the vent; and the compressed-gas supply comprises a compressor mechanically coupled to the movable part, wherein the compressor generates the compressed gas using the motion of the movable part.

19. The invention of claim 18, wherein the compressor has a mechanically actuated pump driven by the motion of the movable part.

20. The invention of claim 18, wherein:

the compressor has an electrical pump and an electrical generator;

the generator generates electricity using the motion of the movable part; and the electrical pump is powered by the electricity and generates the compressed gas.

* * * * *